United States Patent [19]
Hshieh

[11] Patent Number: 5,894,150
[45] Date of Patent: Apr. 13, 1999

[54] CELL DENSITY IMPROVEMENT IN PLANAR DMOS WITH FARTHER-SPACED BODY REGIONS AND NOVEL GATES

[75] Inventor: Fwu-Iuan Hshieh, Saratoga, Calif.

[73] Assignee: Magepower Semiconductor Corporation, San Jose, Calif.

[21] Appl. No.: 08/986,459

[22] Filed: Dec. 8, 1997

[51] Int. Cl.$^6$ .......................... H01L 29/76; H01L 29/94; H01L 31/062; H01L 31/113
[52] U.S. Cl. .............. 257/335; 257/339; 257/329
[58] Field of Search ........................ 257/335, 339, 257/329

[56] References Cited

U.S. PATENT DOCUMENTS 4,972,240  11/1990  Murakami et al. ............... 257/335
5,479,037  12/1995  Hshieh ............................ 257/335

FOREIGN PATENT DOCUMENTS 1 42177  2/1989  Japan .............................. 257/339

Primary Examiner—Stephen D. Meier
Attorney, Agent, or Firm—Bo-In Lin

[57] ABSTRACT

This invention discloses a DMOS planar power device having a plurality of transistor cells formed in a semiconductor substrate with a drain region of a first conductivity type disposed at a bottom surface of the substrate. Each of the DMOS transistor cells includes a polysilicon segment constituting a gate supported on a top surface of the substrate wherein the gate being disposed substantially in a center portion of the transistor cell. The DMOS transistor cell further includes a source region of the first conductivity type disposed in the substrate surrounding edges of the gate with a portion extends underneath the gate. The DMOS transistor cell further includes a body region doped with a body dopant of a second conductivity type disposed in the substrate encompassing the source region. The body region has a portion extending underneath the gate having a under-the-gate distance less than a lateral diffusion of the body dopant and the body region having outer edges extending outwardly to neighboring transistor cells. The DMOS transistor cell further includes a shallow low-concentration first-conductivity-type region under the gate wherein the shallow low-concentration first-conductivity-type region having a depth shallower than a depth of the source region.

7 Claims, 12 Drawing Sheets

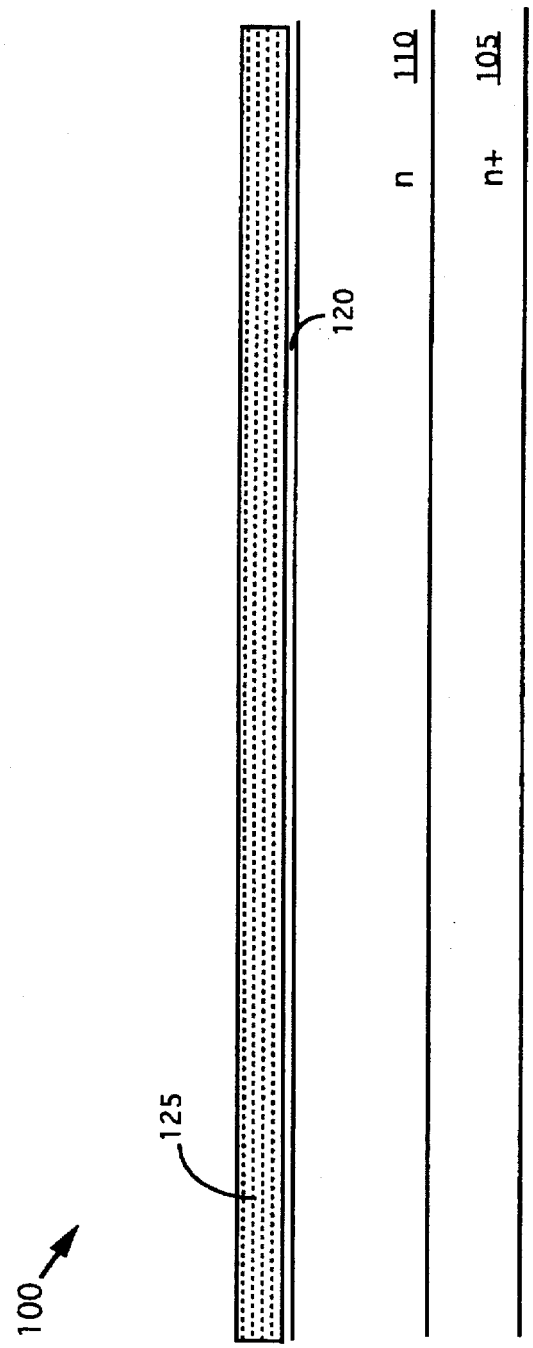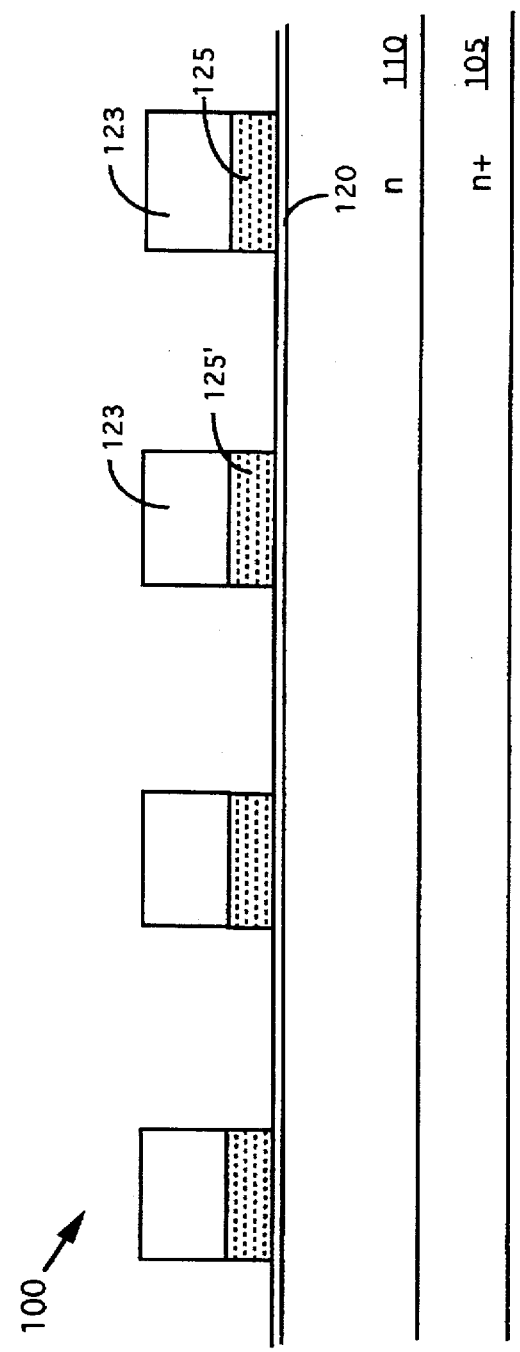

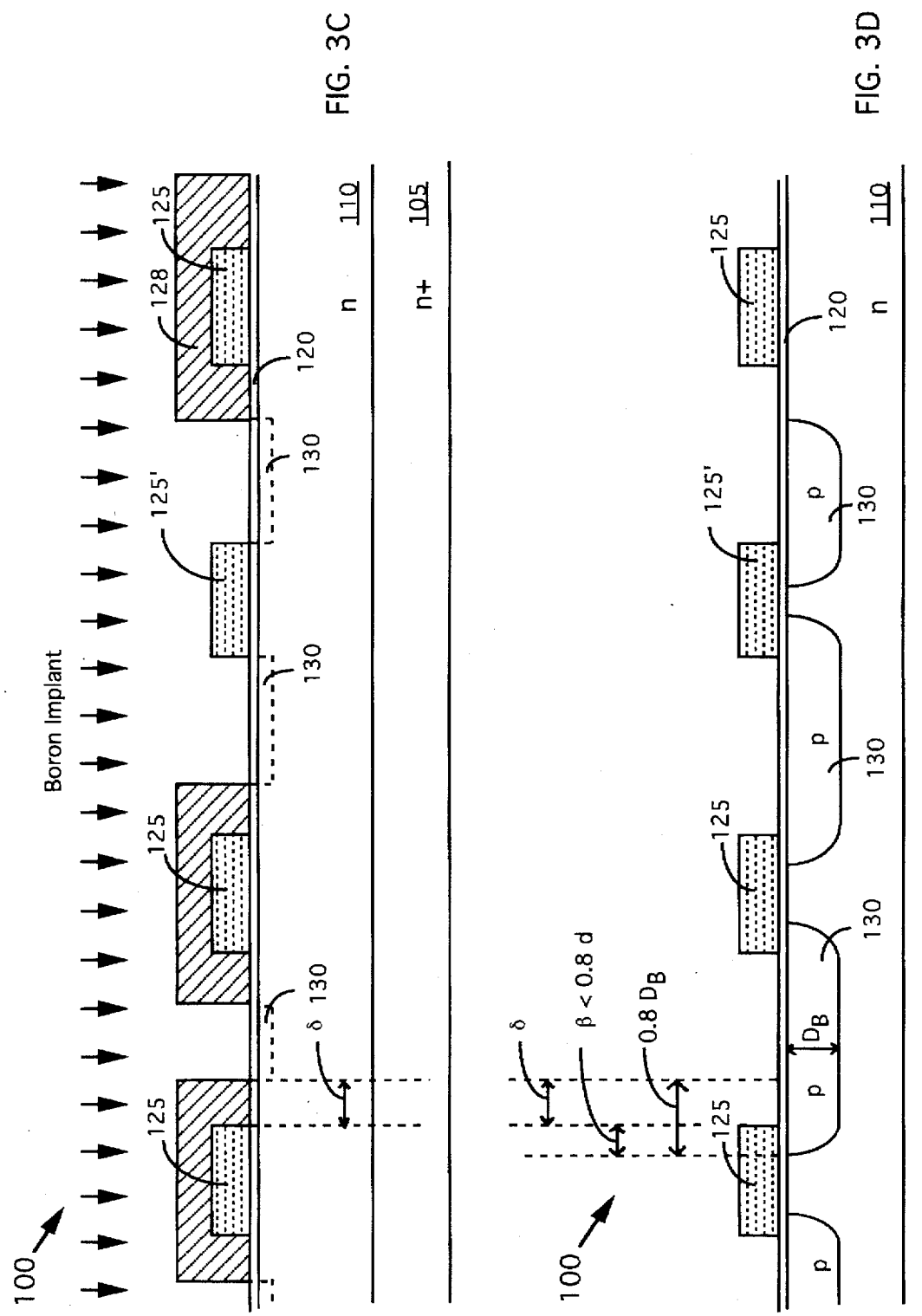

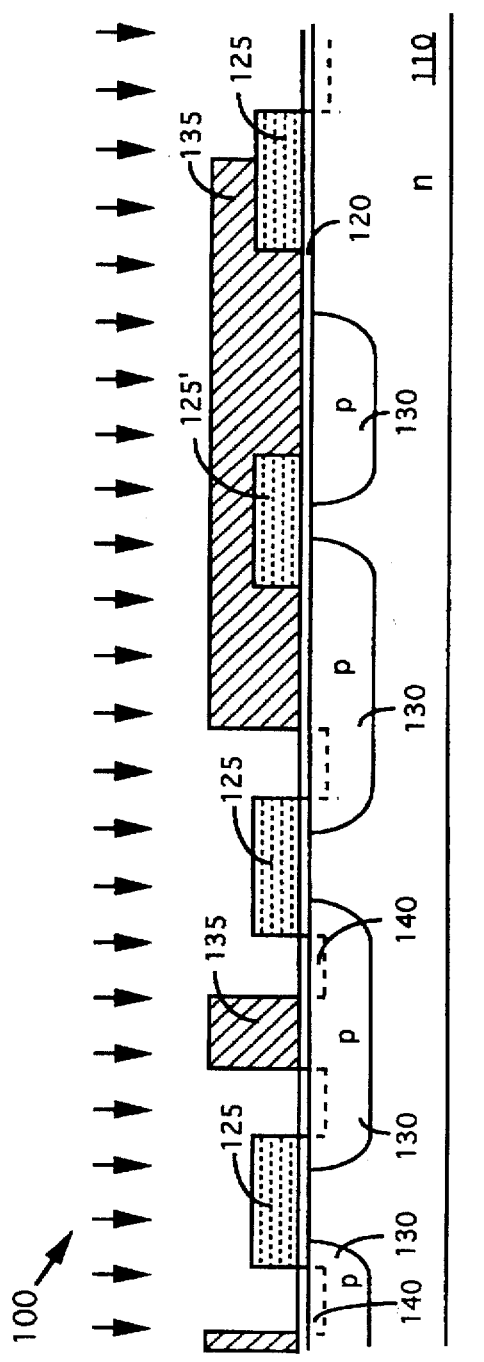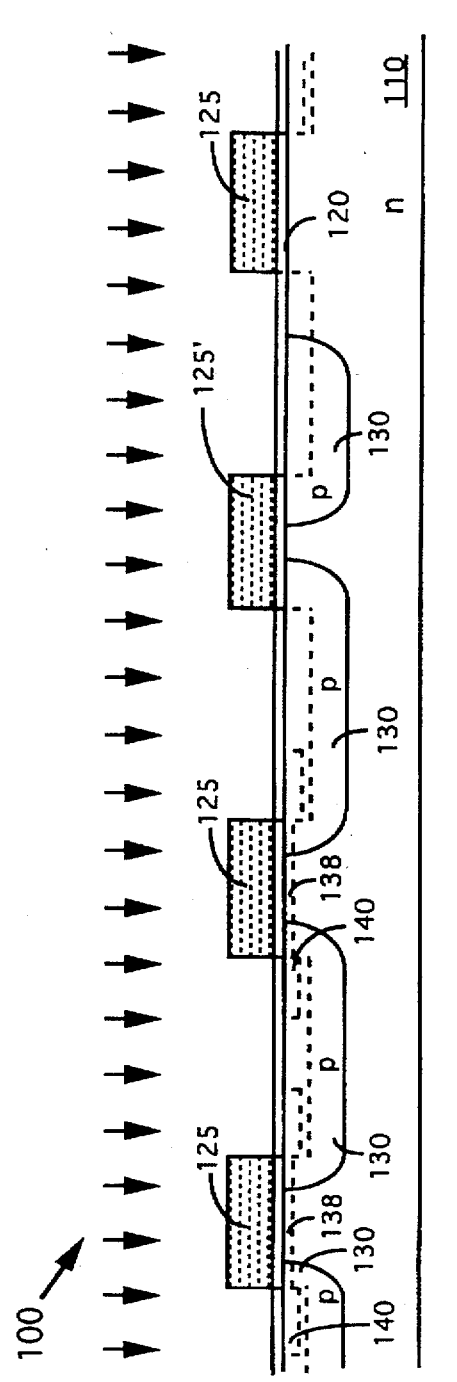

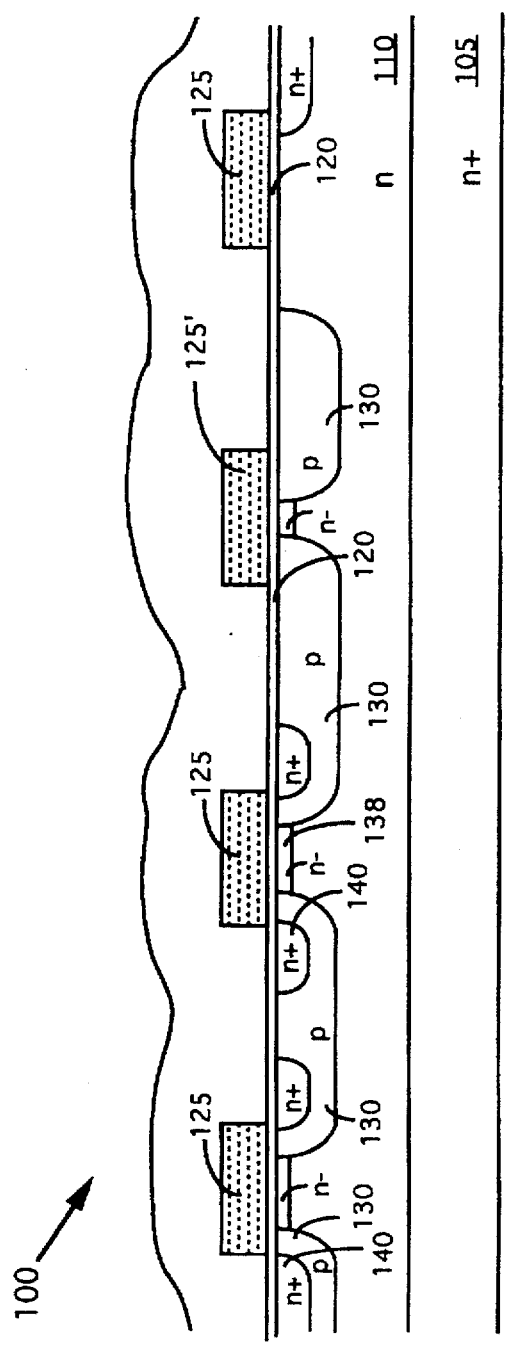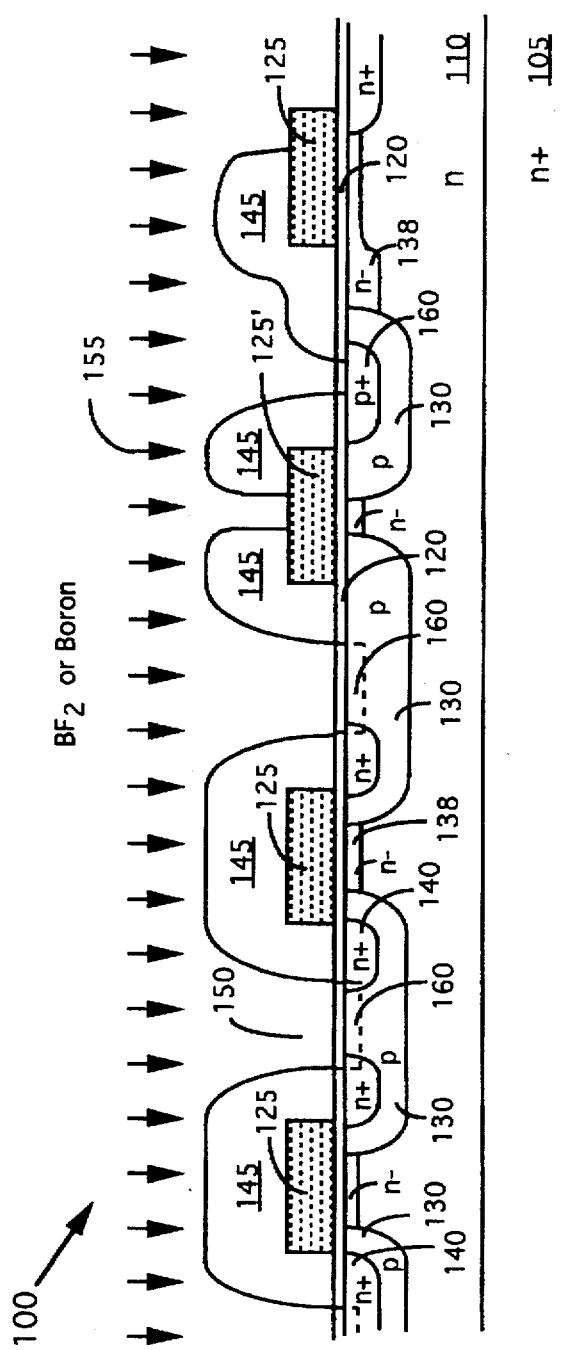

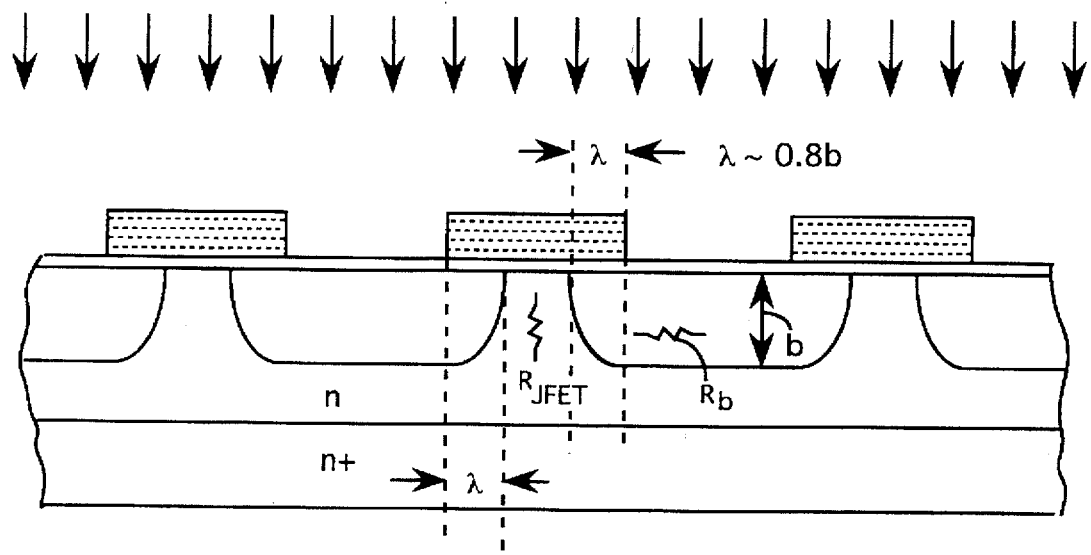
FIG. 3C" (Prior Art)
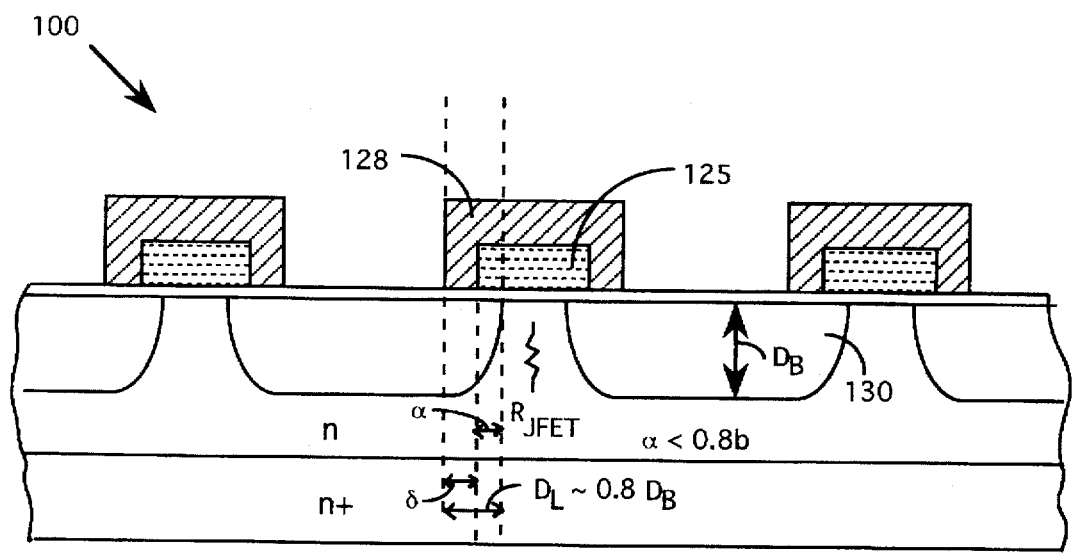
FIG. 3C'

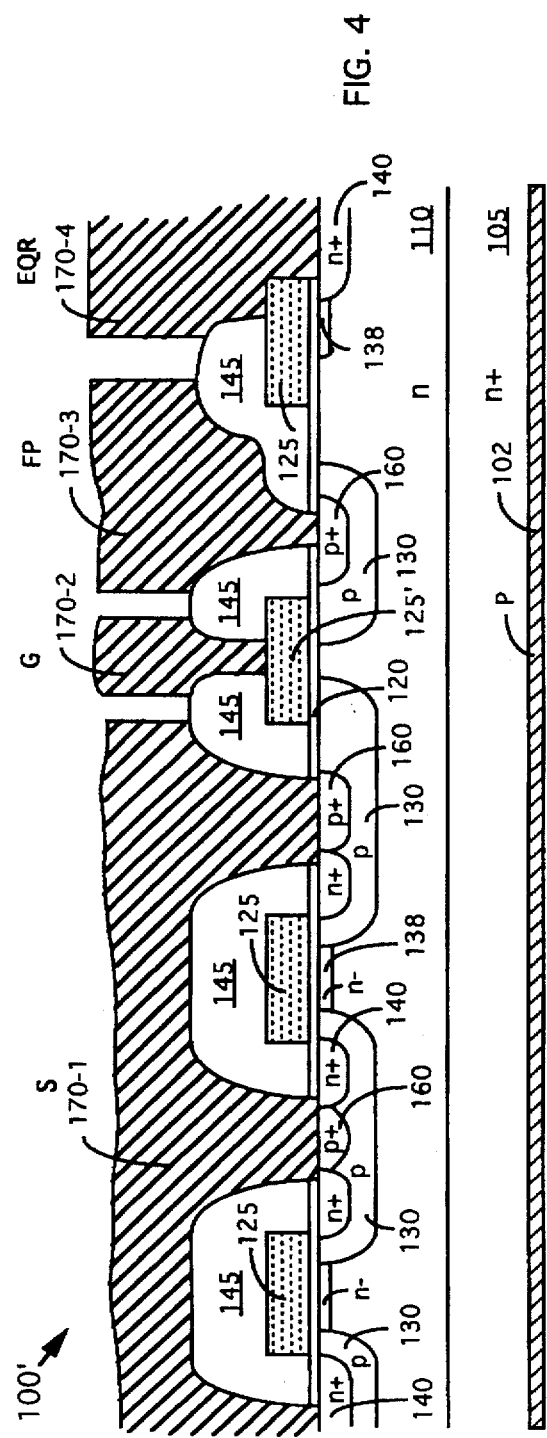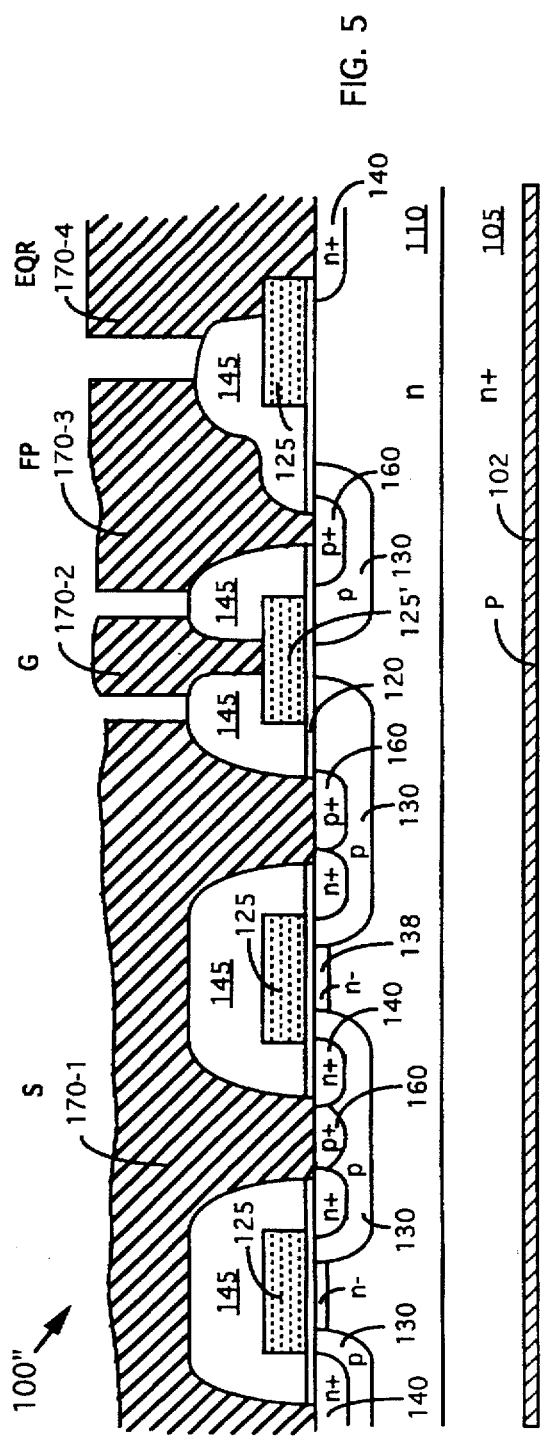

CELL DENSITY IMPROVEMENT IN PLANAR DMOS WITH FARTHER-SPACED BODY REGIONS AND NOVEL GATES

BACKGROUND OF THE INVENTION

1. Field of the Invention

This invention relates generally to the structure and fabrication process of planar DMOS power devices. More particularly, this invention relates to a novel and improved DMOS device structure and fabrication process. Specially configured body mask is employed to laterally shift the body regions such that the body regions are spaced farther away from each other. The size of the DMOS can be reduced by reducing the gate-width without unduly increasing the JFET resistance. This is achieved by maintaining substantially a constant distance between the body regions when the gate-width is reduced. Furthermore, specially configured gapped-gates are formed to reduce the gate capacitance such that the speed of the MOSFET device is increased. Simplified manufacture processes are applied to maintain a low production cost and to improve the device reliability.

2. Description of the Prior Art

Conventional structure and processing steps for fabricating a power metal oxide silicon field effect transistor (MOSFET) power device are limited by several technical difficulties. Specifically, conventional planar cellular structure of power MOSFETs, such as square, circular, and hexagonal topologies are limited by the difficulty that the on-resistance is decreased when the polysilicon space is reduced to achieve higher cell density by shrinking unit cell areas. However, the surface area occupied by the polysilicon gate electrode limits a further increase of cell density for the planar DMOS. Additional reduction in the size of the gate electrode exacerbates the parasitic JFET pinching effect, leading to higher device on-resistance at a small cell pitch. Conversely, if the polysilicon gate dimension is held constant to avoid the pinching effect, and the size of the source/body region, i.e., the opening in the polysilicon, is reduced instead, the specific on-resistance still increases at high cell densities. This is caused by the transistor gate width per unit area decreases. With such electrical and geometric restrictions, the cell density is limited to 6.5 million cells/inch$^2$. For a person of ordinary skill in the art, further increases in planar DMOS cell density is unwarranted and likely to be detrimental to performance. The pinching effect caused by cell pitch reduction has to be eliminated to significantly benefit power MOSFET specific on-resistance. Additionally, the JFET resistance can be reduced with a shallower body junction. However, the breakdown voltage of the device is degraded with shallower body junctions. The tradeoffs of these performance characteristics become designer's dilemmas, which cannot be easily resolved with conventional planar structures and current state of the art manufacturing technology.

FIG. 1 shows a typical vertical double diffused MOS (VDMOS) device which uses a double diffusion technique to control the channel length L. Two successive diffusions are performed with first a p diffusion using boron, then a n diffusion using either arsenic or phosphorus, to produce two closely spaced pn junctions at different depths below the silicon surface. With this pn-junction, as shown in FIG. 1, the VDMOS supports the drain voltage vertically in the N–epitaxial layer. The current flows laterally from the source through the channel parallel to the surface of the silicon. The current flow then turns through a right angle to flow vertically down through the drain epitaxial layer to the substrate and to the drain contact. The p-type "body" region in which the channel is formed when a sufficient positive voltage is applied, and the n+ source contact regions are diffused successively through the same window etched in the oxide layer. The channel length can be controlled through the processing steps. Because of the relative doping concentrations in the diffused.

As discussed above, when the width of the gates is reduced to increase the cell density, the body regions are pulled together. The JFET regions between the body regions are pinched and resulting in a higher JFET resistance, i.e., a higher R-JFET. Typically, for a body dopant such as boron, there is a ratio of lateral diffusion to vertical of approximately 0.8. Therefore, if the depth of the body is b, generally the body regions extend lateral from the edges of the gate with a distance of about 0.8b into a region under the gate. Referring to FIG. 1B, where a conventional MOSFET device is shown with the body regions formed by implanting the body dopant ions, which are blocked by the polysilicon gates. The body regions are then formed by carrying out a body diffusion. The body regions as shown have a depth of b and a lateral diffusion length $\lambda$ of 0.8b measured from the edges of the gate. If the width of the gate is G, then the distance J between the body regions is approximately:

$$J=G-2\lambda=G-2(0.8b)$$

As the width of the gate G is reduced, the distance J between the body regions is also reduced which causes the JFET resistance to increase. It appears, from Equation (1), that a longer distance of J may be maintained by keep a shallow P-body with reduced value of b. However, a shallow body would create several problems, e.g., device punch through, lower breakdown voltage and reduced device ruggedness. For these reasons, in a conventional MOSFET power device, it is difficult to maintain a same JFET resistance when the cell size is reduced.

In addition to above limitations, it is also difficult to improve the switching speed and meanwhile reducing the production cost of the DMOS power device. This is particularly true when the power DMOS devices become more complicate both in cell structure and in device topology. In the meantime, in order to achieve higher switching speed, it is desirable to reduce the gate-to-drain capacitance. However, a device structure capable of providing such performance improvement typically involves the application of more complex fabrication processes. As the fabrication processes become more complex and increased number of masks are required, longer manufacture time cycles become necessary, which leads to higher production costs. Complex fabrication processes with increased number of masks introduce further concerns. As more masks and processing steps are applied, more uncertainties of production yield and product reliability are introduced. The production costs are further impacted due to these undesirable factors. For these reasons, many technical improvements are attempted to improve the device performance to achieve higher switching speed while reducing the number of masks employed for MOSFET fabrication. Several MOSFET device structures and manufacture techniques are also disclosed in U.S. Patents.

In a U.S. Pat. No. 5,273,922, entitled "High Speed Low Gate/Drain Capacitance DMOS Device", (issued on Dec. 28, 1993), as that shown in FIG. 2, Tsoi discloses a DMOS device. Tsoi's device includes a field oxide in the channel between adjacent transistors and an impurity implanted through the same opening in which the field oxide is formed.

The gate is deposited over the field oxide and spaced from the supporting epitaxial layer by the field oxide to reduce the gate-to-drain capacitance. The implant impurity blow the field oxide reduce the on-resistance of the device. With these advantages achievable by Tsoi's DMOS device, it is however limited by a difficulty that the size of the transistors can not be further reduced to increase the cell density. The lateral dimension of a transistor cell is limited by a misalignment tolerance between the polysilicon gate and the field oxide. In order to avoid an increase in the device threshold.

SUMMARY OF THE PRESENT INVENTION

It is therefore an object of the present invention to provide a new DMOS fabrication process to provide an improved device structure with reduced gate-width while maintaining an unchanged dimension of JFET region. The gate-to-drain capacitance is also reduced by providing a doping profile and gapped gate polysilicon gates such that aforementioned limitations and difficulties as encountered in the prior art can be overcome.

Specifically, it is an object of the present invention to provide an improved DMOS fabrication process by applying a special body wrapping around farther-spacing body mask to farther space the body regions away from each other. As the gate width is reduced to achieve higher cell density, the JFET resistance is maintained substantially unchanged by applying this specially configured body mask Another object of the present invention is to provide a novel DMOS fabrication process wherein as high energy body-conductivity type of dopant implant is performed through the gates to form the shallow lightly doped source-conductivity-type regions under the gates to reduced the gate-to-drain capacitance such that the switching speed is improved.

Another object of the present invention is to provide a novel DMOS fabrication process wherein specially configured gaped-polysilicon gates are formed thus reducing the polysilicon surface areas, and of reduced width are formed by applying an undercutting dry etch The switching speed is improved with reduced gate-to-source capacitance by reducing the surface-area occupied by the polysilicon gates while maintaining a low on-resistance when the dimension of the JFET regions is kept unchanged.

Another object of the present invention is to provide an improved DMOS fabrication process wherein the requirement of an active mask to define an active area for etching the initial oxide layer is eliminated by taking advantage of a wrapping-around further-spacing body mask which covers the termination area near the equal potential ring (EQR). The body-dopant ions are blocked in the covered area without requiring a thick initial oxide layer.

Briefly, in a preferred embodiment, the present invention includes a method for fabricating a MOSFET device supported on a substrate. The method includes the steps of (a) growing a gate oxide layer on the substrate followed by depositing a polysilicon layer and applying a gate mask for performing an etch for patterning a plurality of polysilicon segments with a plurality of segments functioning as gate; (b) applying a wrapping-around farther-spacing body mask for wrapping a plurality of gate segments as a body implant blocking mask for implanting a body dopant followed by removing the body mask and carrying out a body diffusion for forming body regions; (c) applying a source blocking mask for implanting a source dopant to form a plurality of source regions followed by implanting a high-energy light-dose body-conductivity-type dopant to form a plurality of shallow low-concentration capacitance-reduction regions under each of said gates then removing the source blocking mask; (c)forming an overlying insulation layer covering the MOSFET device followed by applying a dry oxide etch with a contact mask to open a plurality of contact openings there-through then removing the contact mask; (e) performing a high temperature reflow process for the overlying insulation layer and for driving the source regions into designed junction depths; and (f) depositing a metal layer followed by applying a metal mask for patterning the metal layer to define a plurality of metal segments.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 3A to 3I are a series of cross sectional views for illustrating the processing steps for manufacturing a planar DMOS device of the present invention;

FIGS. 3C' and 3C" are cross sectional views of several partially manufactured DMOS transistor cells for comparison with a prior art DMOS transistor cell with respect to the width of the JFET regions between the body regions;

FIG. 4 is a cross sectional view for an alternate preferred embodiment for a DMOS power device of the present invention;

FIG. 5 is a cross sectional view for an alternate preferred embodiment for a DMOS power device of the present invention;

DETAILED DESCRIPTION OF THE PREFERRED EMBODIMENT

Figure 3I:
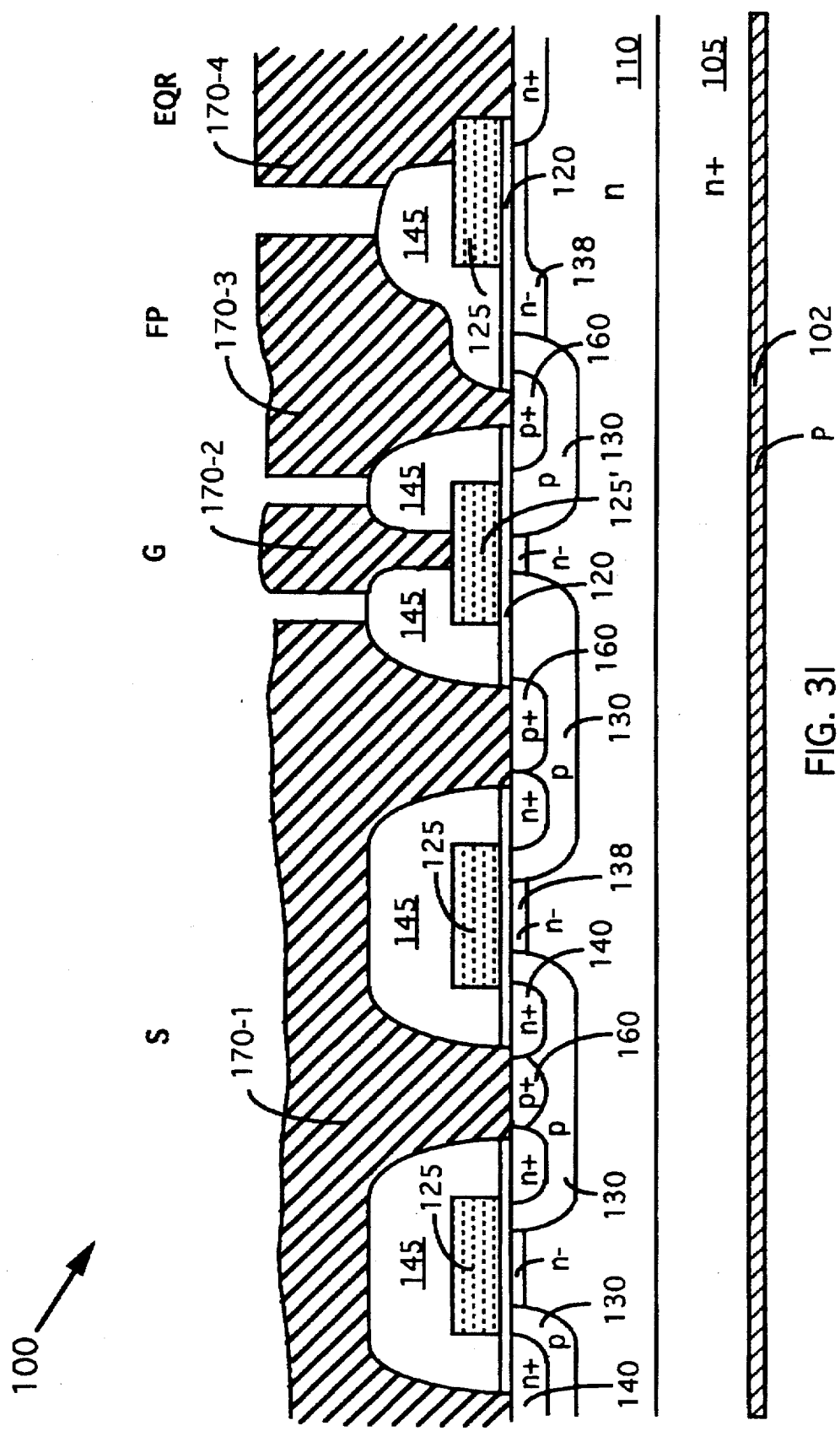

Referring to FIGS. 3A to 3I for the processing steps applied to manufacture the DMOS device 100. As shown in FIG. 3A, the processing steps begins by first growing a N- epitaxial layer 110 with a resistivity ranging from 0.1 to 10 ohm-cm on top of a N+ substrate 105. The substrate has a resistivity of 0.001 to 0.02 ohm-cm. The thickness and the resistivity of the epitaxial layer 110 depend on the requirements for the on-resistance and breakdown voltage. In a preferred embodiment, the thickness of the epi-layer 110 is about six to eight microns. A gate oxide layer 120 of thickness in the range of 100 to 1000 Angstroms is grown. A polysilicon layer 125 having a thickness of approximately 3000 to 10,000 Angstroms is then deposited. A $POCL_3$ doping process is carried out followed by an arsenic (As) implant with an ion beam of energy at 60–80 Kev with a flux density in the range between 5 to $8 \times 10^{15}/cm^2$.

In FIG. 3B, a polysilicon mask 123 is applied for carrying out an an-isotropic etching to pattern the polysilicon layer 125 into a plurality of polysilicon segments. The polysilicon mask is then removed after these plurality of silicon segments 125 are defined. Some of these polysilicon segments function as a gate for each of transistor cells. Referring to FIG. 3C, a wrapping-around farther-spacing body blocking mask 128 is employed to cover the gates 125, except a gate-runner segment 125', in a wrapping around manner. The areas surround the gate 125 are also covered. The covered areas extends laterally with a distance δ and near the polysilicon segment 125". A thick initial oxide layer is not required and the processing steps can be implemented without requiring an active mask.

In FIG. 3D, the body blocking 128 is removed and a p-body diffusion process is carried out. The body diffusion process is performed at an elevated temperature of 1,000–1, 200° C. for ten minutes to three hours to increase the depth of the p-body region 130 to 1.0–6.0 µm. As shown in FIG. 3D, the body regions 130 has a depth represented by $D_B$. Referring to FIG. 3C' for a comparison of the width of the JFET regions spaced between the body regions 130. By applying a wrapping-around farther-spacing body blocking mask 128, the width of the JFET regions can be maintained the same as that of the prior art while the gate 125 can be further shrunken. Since the lateral diffusion length $D_L$ of the body dopant is approximately 0.8 of the vertical diffusion length. It follows that $$D_L = 0.8 \, D_B \tag{1}$$

The p-body regions 130 are laterally diffused with a distance a from the edge of the gate 125 to a region underneath the gate, where:

$$\alpha = D_L - \delta = 0.8 \, D_B - \delta \tag{2}$$

Therefore, $$\alpha = 0.8 \, D_B - \delta < 0.8 \, D_B \tag{3}$$

Figure 1:
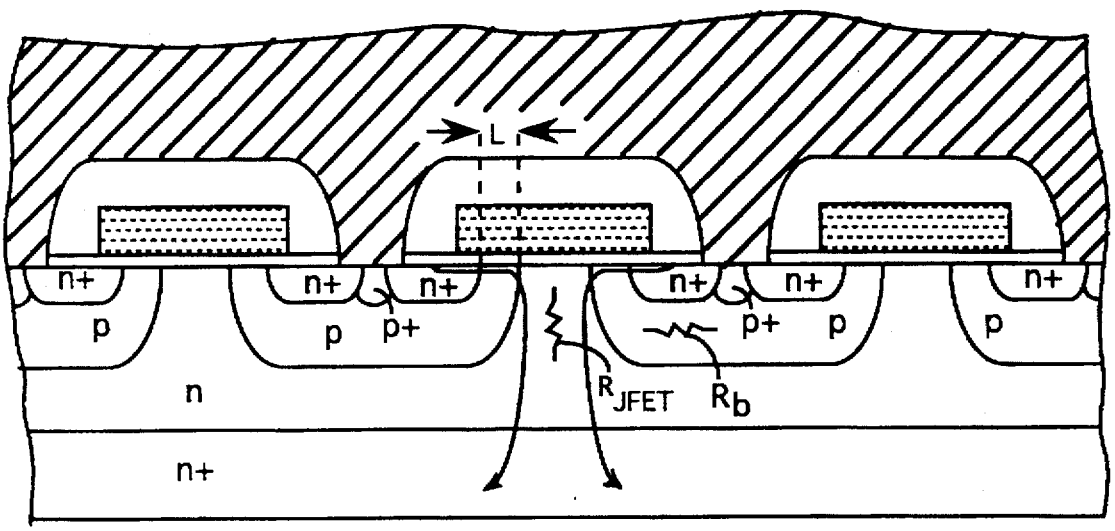
FIG. 1 is cross sectional view of a prior art MOSFET device wherein reduction of the width of gates in order to produce power device of higher transistor cell density directly causes the JFET resistance to increase.
Figure 2:
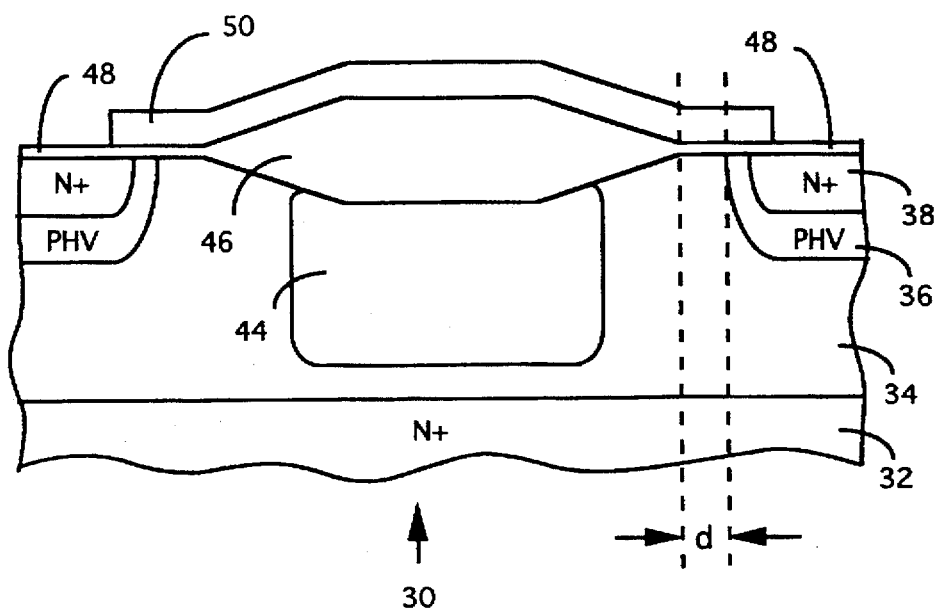
FIG. 2 is a cross sectional view of a prior art DMOS device having a field oxide formed in the channel between adjacent transistors.

Therefore, the width of the gate 125 is now reduced from G to G−2δ while the width of the JFET regions, i.e., $W_{JFET}$ between the p-body regions 130 is maintained substantially the same as:

$$W_{JFET} = G - 2\lambda = G - 2*(0.8)D_B = G - 1.6 \, D_B \tag{4}$$

when compared to a prior art DMOS device of FIG. 2.

Referring to FIG. 3E, a source-blocking mask 135 is applied to carry out an N$^+$ implant to form the N$^+$ region 140. The N$^+$ implantation is carried out with an ion beam at an energy of 60–100 Kev and ion flux density of $5 \times 10^{15}$ to $1 \times 10^{16}$/cm$^2$. In FIG. 3F, after the resist is stripped, the N$^+$ source regions 140 are driven into desired junction depth ranging from 0.2 to 1.0µ by a diffusion process. Then, a high energy body dopant implant with a high energy ion beam of boron 132 at energy of about 200 to 400 Kev and ion flux density of $3 \times 10^{11}$ to $3 \times 10^{12}$/cm$^2$ is carried out. A plurality of gate-to-drain capacitance, i.e., $C_{GD}$, reduction zones 138 are implanted with light-dose high-energy body-conductivity-type dopant, e.g., p-type ions, such that the n-type dopant concentrations in these zones are reduced. The reduced dopant concentration in the zones 138 formed underneath the gate 125 provides an advantage that gate-to-drain capacitance, i.e., $C_{GD}$, is reduced. These $C_{GD}$ capacitance reduction zones 138 are formed under the gates 125 with a depth less than the junction depth of the source region 140 and are typically less than 0.4 micrometers. Because the depth of these capacitance-reduction zones 138 is less than the junction depth of the source regions 140, the reduced source-conductivity-type dopant concentration, i.e., n$^-$ type, in these zones will not cause the on-resistance to increase. Also, because of the light-dose of implantation in these zones, the reduced n-type dopant concentrations underneath the gates 125 would not adversely increase the threshold voltage.

The source implant and the high-energy body-conductivity-type dopant implant to form the capacitance reduction zones 138 are carried out after the body region diffusion. The difficulties arising from dopant profile redistribution due to the dopant diffusion processes resulting from high temperature longer thermal cycles are eliminated. The dopant profiles of the source regions and the shallow low-concentration doping regions 138 for gate-to-drain capacitance reduction will not be driven to a greater depth by applying thermal cycles of lower temperatures and shorter duration. Also, the difficulties caused by the misalignment problems as those encountered in Tsoi's patents are therefore resolved by the use of the wrapping-around farther-spacing body blocking mask 128.

Referring to FIG. 3G, a BSG or BPSG layer is deposited to form an overlying insulation layer 145 of about 5,000 to 15,000Å in thickness. A contact mask is applied to perform an etch process to define a plurality of contact windows 150. Implantation of a boron ion-beam 155, i.e., a body-conductivity-type dopant, is carried out to form a shallow high-concentration body-conductivity-type region 160. The boron implanted is performed with either a low energy boron implant with an ion flux of $1 \times 10^{14}$ to $2 \times 10^{15}$/cm$^2$ at about 20 to 60 Kev or a high energy BF$_2$ implant with an ion flux of $1 \times 10^{14}$/cm$^2$ to $2 \times 10^{15}$ at about 100–240 Kev. Referring to FIG. 3I, a BPSG reflow and densification process is performed at 900–950° C. for thirty minutes to one hour. The shallow body regions 160 are activated. A metal layer 170 is then deposited over the insulation layer 145. The metal layer 170 are then patterned to provide metal segments, e.g., source metal segment 170-1, gate metal segment 170-2, field-plate 170-3, and equal potential ring segment 170-4, to serve the function as electric contact terminals.

FIG. 4 is a cross sectional view for an alternate preferred embodiment for a DMOS power device 100' manufactured according to a set of similar processing steps described above. The only difference of a processing step for manufacturing a DMOS shown in FIG. 4 is to perform the high energy boron implant before the source block mask 135 is removed. The capacitance reduction region 138 implanted between the field plate and the equal potential ring (EQR) as that shown in FIG. 3I, is blocked by the source blocking mask. Compared to the device 100 as that shown in 3I, the low concentration source-conductivity-type region 138' formed under the EQR 170-4 has a smaller width.

FIG. 5 is a cross sectional view of another DMOS power device 100" manufactured according to a set of similar processing steps described above. The only difference of a processing step for manufacturing a DMOS 100" shown in FIG. 5 is to skip the processing step of performing the high energy boron implant In this preferred embodiment there is no capacitance reduction region 138 as that shown in FIG. 3I. A high cell density is achieved because the body regions 130 are formed with a shorter distance between the gates. By controlling the lateral structure of the cells for allowing lateral diffusion of the body regions, the difficulties of increased JFET resistance at higher cell density is resolved.

Figure 6A:
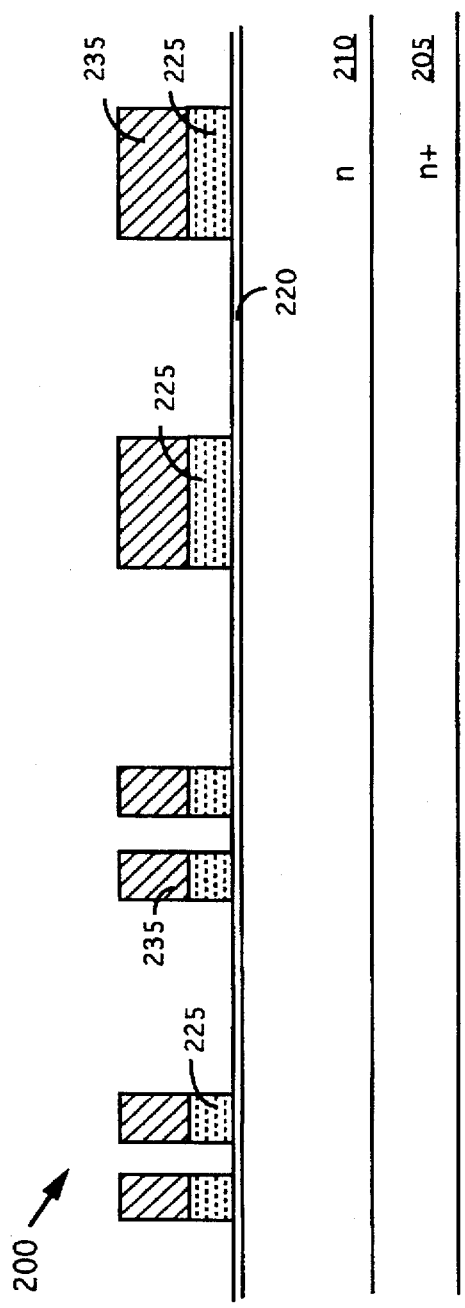
FIGS. 6A to 6E are a series of cross sectional view for illustrating the manufacturing steps for making a DMOS power device with improved switching speed of this invention.

Referring to FIGS. 6A to 6E for the processing steps applied to manufacture an alternate DMOS device 200 with reduced gate-to-drain capacitance. As shown in FIG. 6A, the processing steps begins by first growing a N− epitaxial layer 110 on top of a N+ substrate 205. The resistivity of the substrate and the thickness and resistivity of the epitaxial layer are substantially similar to that shown in FIG. 3A. These parameters depend on the requirements for the on-resistance and breakdown voltage. In a preferred embodiment, the thickness of the epitaxial-layer 110 is about six to eight microns. A gate oxide layer 220 of thickness in the range of 100 to 1000 Angstroms is grown. A polysilicon layer 225 having a thickness of approximately 3000 to 10,000 Angstroms is then deposited. A $POCL_3$ doping process is carried out followed by an arsenic (As) implant with an ion beam of energy at 60–80 Kev with a flux density in the range between 5 to $8 \times 10^{15}/cm^2$. A polysilicon mask 223 is applied for carrying out an an-isotropic etching to pattern the polysilicon layer 225 into a plurality of polysilicon segments. A plurality of gaped-gates 225, each having a gap 228, are defined by these polysilicon segments. Two outmost polysilicon segments 225' and 225" are reserved as gate-runners and equal potential ring (EQR) as will be further described below.

Figure 6B:
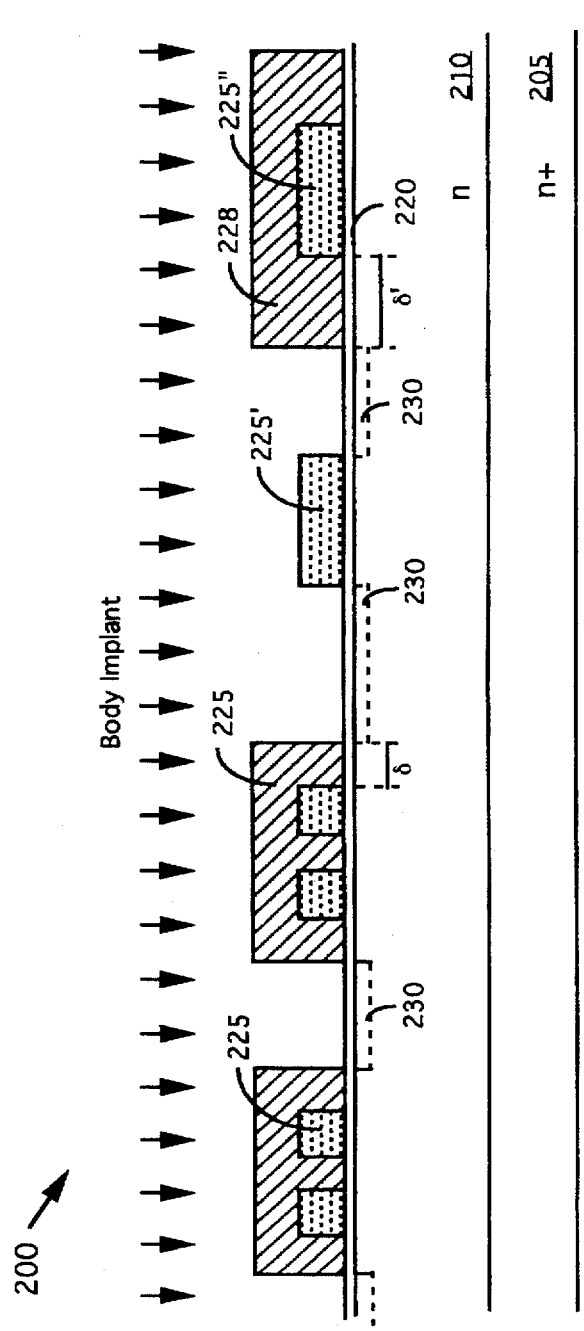

Referring to FIG. 6B, the polysilicon mask 223 is removed. Implant 209 is performed using ion beam, of $3 \times 10^{13}$ to $3 \times 10^{14}/cm^2$ in flux density at an energy ranging from 30 to 80 Kev.

Figure 6C:
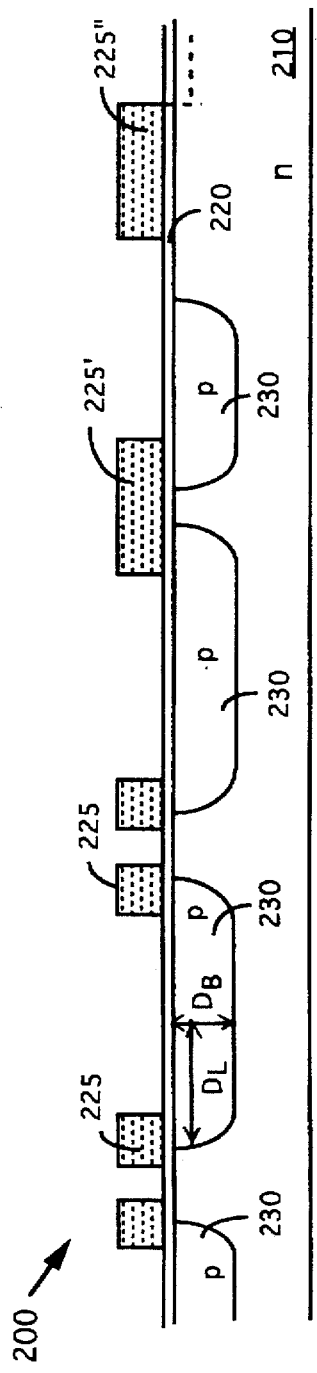

In FIG. 6C, the body blocking 228 is removed and a p-body diffusion process is carried out The body diffusion process is performed at an elevated temperature of 1,000–1,200° C. for ten minutes to three hours to increase the depth of the p-body region 230 to 1.0–6.0 μm. As shown in FIG. 6C, the body regions 230 has a depth represented by $D_B$ and has a lateral diffusion length $D_L$ of the body dopant The lateral diffusion length $D_L$ is approximately 0.8 of the vertical diffusion length. It follows that $D_L = 0.8\ D_B$, i.e., Equation (1). The p-body regions 230 are laterally diffused with a distance β from the edge of the gate 225 to a region underneath the gate, where $\beta = D_L - \delta = 0.8\ D_B - \delta$, i.e., Equation (2). Therefore, the distance for the portion of the body regions 230 under the gate from the edge of the gate β is 0.8 $D_B - \delta'$ which is less than 0.8 DB. By using the wrapping-around farther-spacing body mask 228, the body regions 230 are spaced farther away from each other by a distance of 2δ'.

Figure 6D:
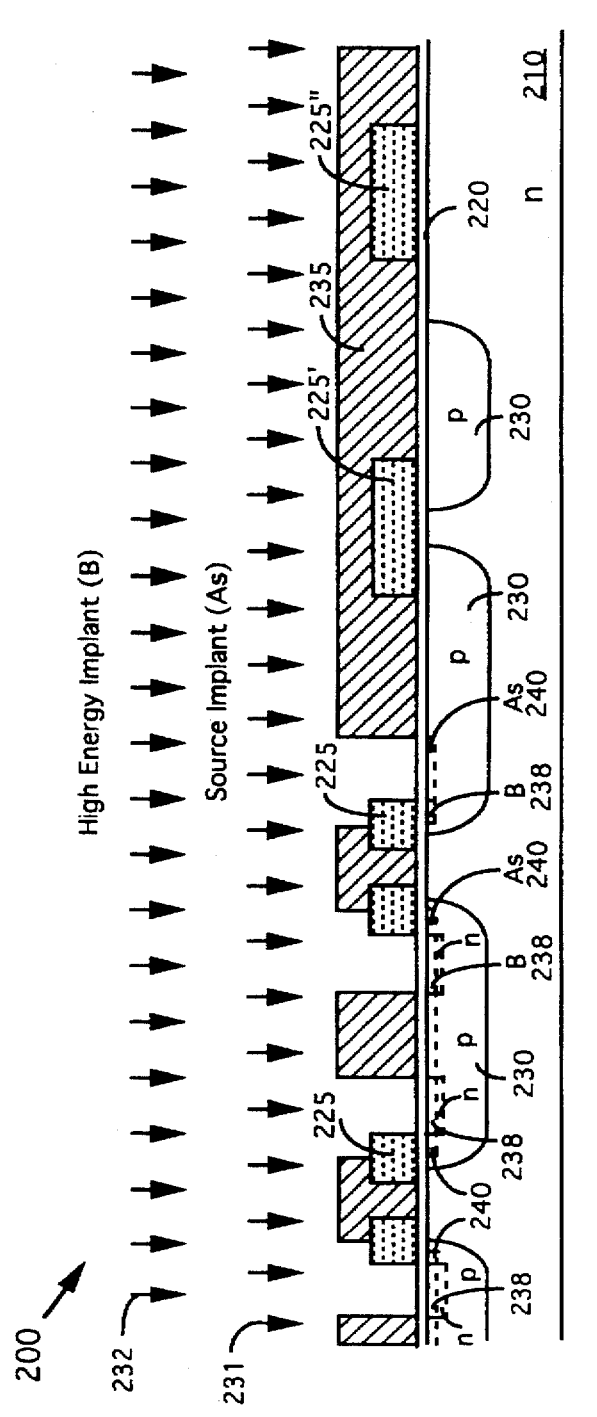
Figure 6E:
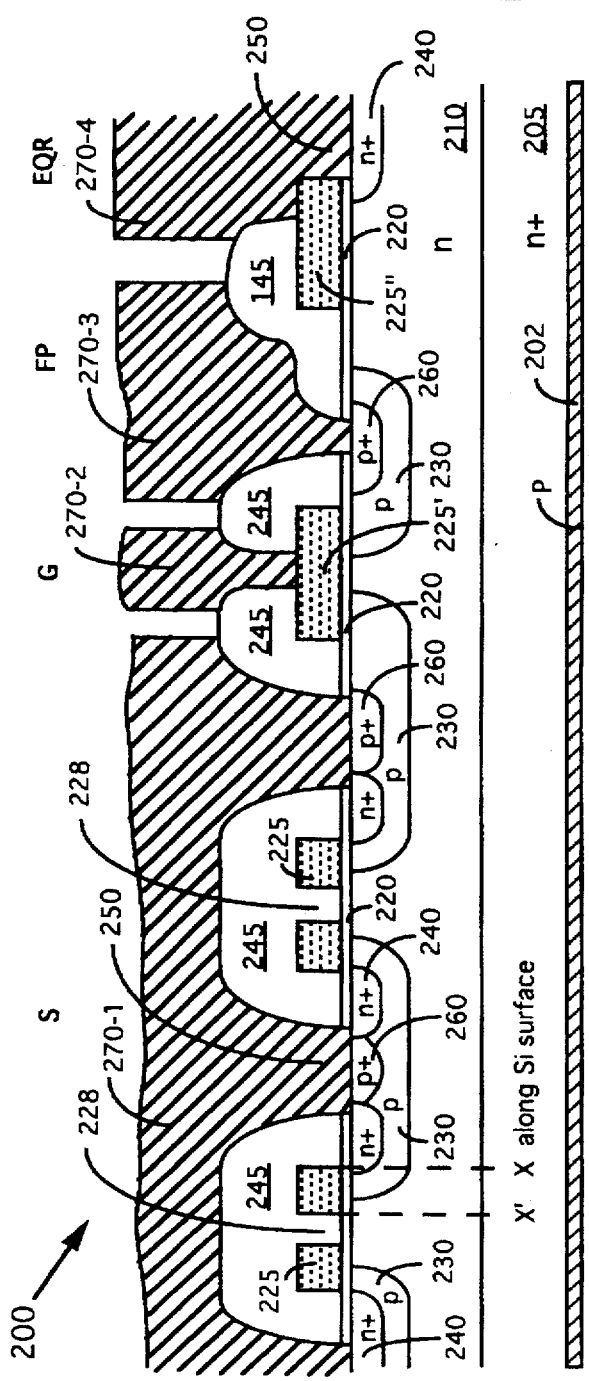

Referring to FIG. 6D, a source-blocking mask 235 is applied to carry out an $N^+$ implant to form the $N^+$ region 240. The $N^+$ implantation is carried out with an ion beam 231 at an energy of 60–100 Kev and ion flux density of $5 \times 10^{15}$ to $1 \times 10^{16}/cm^2$. A high energy body dopant implant with a high energy ion beam of boron 232 at energy of about 200 to 400 Kev and ion flux density of $3 \times 10^{11}$ to $3 \times 10^{12}/cm^2$ is carried out to form a plurality of high-concentration body-dopant regions 238 under the gaped-gates 225. In FIG. 6E, after the resist is stripped, the $N^+$ source regions 240 are driven into desired junction depth ranging from 0.2 to 1.0μ by a diffusion process. Then, a BSG or BPSG layer is deposited to form an overlying insulation layer 245 of about 5,000 to 15,000Å in thickness. A contact mask is applied to perform an etch process to define a plurality of contact windows 250. Implantation of a boron ion-beam is carried out to form a shallow high concentration body region 260. The boron implanted is performed with either a low energy boron implant with an ion flux of $1 \times 10^{14}$ to $2 \times 10^{15}/m^2$ at about 20 to 60 Kev or a high energy $BF_2$ implant with an ion flux of $1 \times 10^{14}/cm^2$ to $2 \times 10^{15}$ at about 100–240 Kev. A BPSG reflow and densification process is performed at 900–950° C. for thirty minutes to one hour. The shallow body regions 260 are activated. A metal layer 270 is then deposited over the insulation layer 245. The metal layer 270 are then patterned to provide metal segments, e.g., source metal segment 270-1, gate metal segment 270-2, field-plate 270-3, and equal potential ring segment 270-4, to serve the function as electric contact terminals.

Figure 6F:
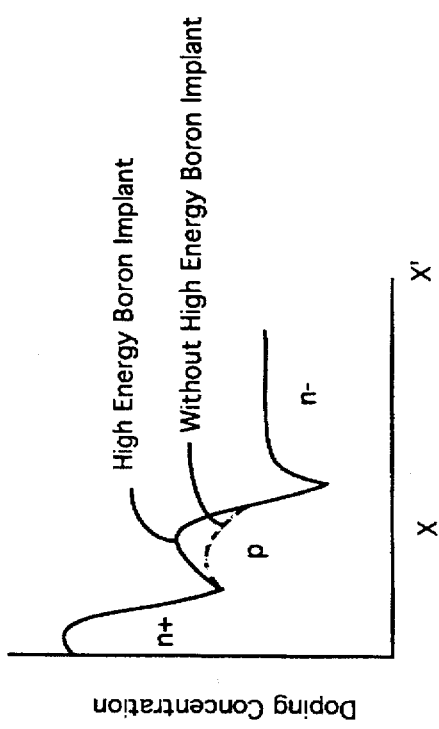
FIG. 6F is a diagram for comparing the net doping concentration with and without a high energy body-conductivity-type dopant implant.

FIG. 6F illustrates the net doping concentration along the top surface of the silicon substrate between X and X'. Particular attention is directed to the variations of the body-doping concentration in the p-body region 230 with and without the high energy boron implant to form the high concentration body dopant regions 238 in FIG. 6D. A higher peak doping concentration is provided when a high energy body-dopant implant is performed through the source blocking mask 235. With the higher peak body doping concentration as that shown in FIG. 6F, an early punch through of the DMOS 200 is prevented. Specifically, in a preferred embodiment, with the high energy boron implant with an ion flux of $3 \times 10^{11}$ to $3 \times 10^{12}/cm^2$ at about 200 to 400 Kev.

Figure 7:
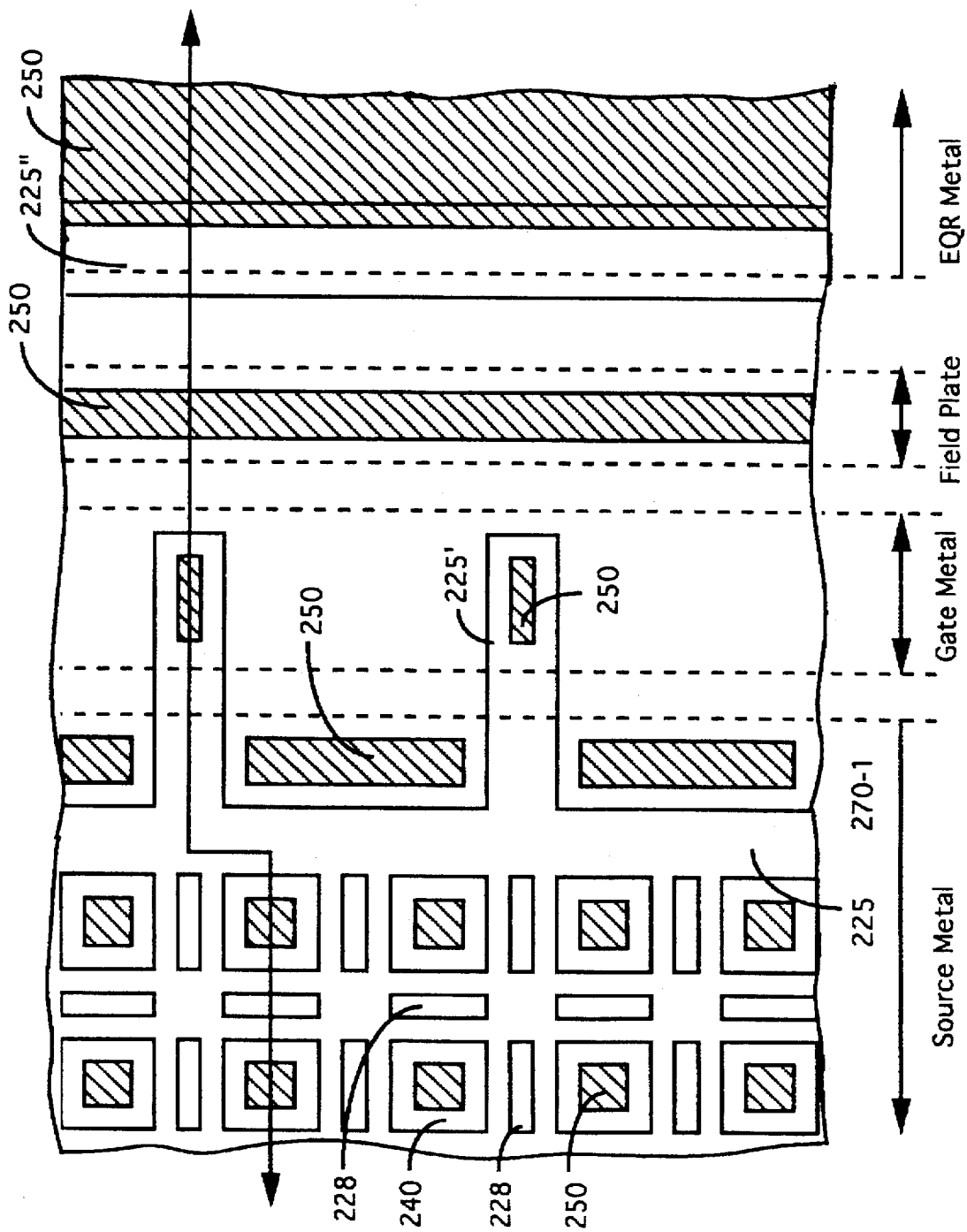
FIG. 7 is a top view of a DMOS power device of FIG. 6E.

The planar DMOS device as shown in FIG. 6E further provides another advantage. The gate-to-drain capacitance $C_{GD}$ is reduced. As the capacitance is linearly proportional to the surface area of the gate 225, the gate-to-drain capacitance is reduced with the surface area of the gate reduced by the gapes 228. FIG. 7 is a top view of the planar DMOS power device 200. The cross sectional view along the line C-C' is shown in FIG. 6E. In the core cell area, the source regions 240 are shown to surround the contact windows 250 where the source metal segment 270-1 contacts the shallow high body-dopant region 260. A plurality of gaps 228 are opened between the cells thus reducing the total area of the polysilicon gates. A reduced gate-to-drain capacitance is achieved. By reducing the gate-to-drain capacitance, the switching speed of the device 200 is improved.

Therefore, the present invention provides a new DMOS fabrication process to provide an improved device structure with reduced gate-width while maintaining an unchanged dimension of JFET region. Also, by providing a doping profile and gapped gate polysilicon gates for the DMOS transistor cells, the gate-to-drain capacitance is reduced such that the limitations and difficulties as encountered in the prior art can be overcome. Specifically, an improved DMOS fabrication process is implemented by applying a special wrapping-around farther-spacing body-blocking mask to farther space the body regions away from each other. As the gate width is reduced to achieve higher cell density, the JFET resistance is maintained substantially unchanged by applying this specially configured body-blocking mask. A high-energy body-conductivity type of dopant implant is performed through the gates to form the shallow lightly doped source-conductivity-type regions under the gates to reduced the gate-to-drain capacitance such that the switching speed is improved. In an alternate preferred embodiment, specially configured gaped-polysilicon gates are formed thus reducing the polysilicon surface areas. The switching speed is improved with reduced gate-to-source capacitance by reducing the surface-area occupied by the polysilicon gates while maintaining a low on-resistance when the dimension of the JFET regions is kept unchanged. The requirement of an active mask to define an active area for etching the initial oxide layer is eliminated by taking advantage of a wrapping-around further-spacing body-blocking mask which covers the termination area near the equal potential ring (EQR). The body-dopant ions are blocked in the covered area without requiring a thick initial oxide layer. Cost savings are achieved by eliminating this requirement of applying an active mask.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A DMOS power device having a plurality transistor cells formed in a semiconductor substrate with a drain region of a first conductivity type disposed at a bottom surface of the substrate, wherein each of said DMOS transistor cells comprising:

a polysilicon segment constituting a gate supported on a top surface of said substrate wherein said gate being disposed substantially in a center portion of said transistor cell;

a source region of said first conductivity type disposed in said substrate surrounding edges of said gate with a portion extends underneath said gate;

a body region doped with a body dopant of a second conductivity type disposed in said substrate encompassing said source region having a portion extending underneath said gate having an under-the-gate distance, $\beta$, wherein $\beta$ being less than a lateral diffusion length $D_L$ of said body dopant thus defining an increased-width of $2\delta = 2(D_L - \beta) > 0$ for a JFET region between two-portions of said body region under said gate, and said body region having outer edges extending outwardly to neighboring transistor cells; and a shallow low-concentration first-conductivity-type region under said gate wherein said shallow low-concentration first conductivity type region having a depth shallower than a depth of said source region.

2. The DMOS power device of claim 1 wherein:

said body region further includes a shallow high concentration body-conductivity-type region near a top surface of said substrate provided for opening a source contact thereon to allow a source contact metal segment to contact said body regions whereby a contact resistance between a metal segment and said body region is reduced.

3. The DMOS power device of claim 1 wherein:

said shallow low-concentration first-conductivity-type region under said gate having a depth less than 0.4 micrometers.

4. A DMOS power device having a plurality transistor cells formed in a semiconductor substrate with a drain region of a first conductivity type disposed at a bottom surface of the substrate, wherein each of said DMOS transistor cells comprising:

a gapped polysilicon segment constituting a gapped-gate supported on a top surface of said substrate wherein said gate being disposed substantially in a center portion of said transistor cell;

a source region of said first conductivity type disposed in said substrate surrounding edges of said gate with a portion extends underneath said gate;

a body region doped with a body dopant of a second conductivity type disposed in said substrate encompassing said source region having a portion extending underneath said gate having an under-the-gate distance, $\beta$, wherein $\beta$ being less than a lateral diffusion length $D_L$ of said body dopant thus defining an increased-width of $2\delta = 2(D_L - \beta) > 0$ for a JFET region between two-portions of said body region under said gapped gate, and said body region having outer edges extending outwardly to neighboring transistor cells; and a shallow low-concentration first-conductivity-type region under said gate wherein said shallow low-concentration first conductivity type region having a depth shallower than a depth of said source region.

5. The DMOS power device of claim 4 wherein:

said body region further includes a shallow high concentration body-conductivity-type region near a top surface of said substrate provided for opening a source contact thereon to allow a source contact metal segment to contact said body regions whereby a contact resistance between a metal segment and said body region is reduced.

6. The DMOS power device of claim 5 wherein:

said shallow low-concentration first-conductivity-type region under said gate having a depth less than 0.4 micrometers.

7. The DMOS power device of claim 4 wherein:

said body region further includes a shallow high concentration body-conductivity-type region disposed under said gapped gate next to said source region for preventing an early punch-through.

* * * * *